United States Patent
Taddiken et al.

(10) Patent No.: US 8,138,815 B2
(45) Date of Patent: Mar. 20, 2012

(54) LEVEL CONVERTER

(75) Inventors: Hans Taddiken, Munich (DE); Herbert Kebinger, Mettenheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/011,665

(22) Filed: Jan. 21, 2011

(65) Prior Publication Data

US 2011/0109370 A1     May 12, 2011

Related U.S. Application Data

(63) Continuation of application No. 12/323,694, filed on Nov. 26, 2008, now Pat. No. 7,880,527, which is a continuation-in-part of application No. 11/875,120, filed on Oct. 19, 2007, now abandoned.

(30) Foreign Application Priority Data

Oct. 20, 2008   (DE) .......................... 10 2008 052 351

(51) Int. Cl.
*H03L 5/00*     (2006.01)

(52) U.S. Cl. ............... 327/333; 326/62; 326/63; 326/68

(58) Field of Classification Search .................. 327/333; 326/62, 63, 68, 80, 81; 365/189.11
See application file for complete search history.

(56) References Cited

U.S. PATENT DOCUMENTS

| | | | |
|---|---|---|---|
| 5,973,508 | A | 10/1999 | Nowak et al. |
| 6,690,605 | B2 | 2/2004 | Schaefer et al. |
| 6,853,233 | B1 | 2/2005 | Terletzki et al. |
| 7,106,123 | B2 | 9/2006 | Kanno et al. |
| 2004/0252558 | A1* | 12/2004 | Umezawa ................ 365/189.11 |
| 2005/0040852 | A1 | 2/2005 | Mentze et al. |
| 2005/0190612 | A1* | 9/2005 | Kanno et al. ............. 365/189.09 |
| 2006/0125521 | A1 | 6/2006 | Kim |
| 2006/0164122 | A1 | 7/2006 | Yeh |
| 2010/0309716 | A1* | 12/2010 | Tsukada ....................... 365/163 |

FOREIGN PATENT DOCUMENTS

WO    WO 03/032431 A2    4/2003

* cited by examiner

*Primary Examiner* — Lincoln Donovan
*Assistant Examiner* — Brandon S Cole
(74) *Attorney, Agent, or Firm* — Slater & Matsil, L.L.P.

(57) ABSTRACT

A level converter for providing an output signal at a circuit output based on an input signal includes an output coupling circuit formed to provide an output signal based on a first partial output signal and a second partial output signal, a driver circuit formed to provide the second partial output signal such that the second partial output signal is switchable between two different signal levels depending on the state of the input signal, wherein an input of the driver circuit is capacitively coupled to the input of the level converter in order to allow for switching between the signal levels of the second partial output signal by the capacitive coupling in response to a change in the state of the input signal, and a holding circuit formed to keep the state of the second partial output signal constant in case of a constant state of the input signal.

21 Claims, 11 Drawing Sheets

LEVEL CONVERTER

This application is a continuation of patent application Ser. No. 12/323,694, now U.S. Pat. No. 7,880,527, entitled, "Level Converter," filed on Nov. 26, 2008, which is a continuation-in-part of patent application Ser. No. 11/875,120, entitled "Level Converter," filed on Oct. 19, 2007 and which claims priority to German Patent Application 10 2008 052 351.8, filed on Oct. 20, 2008, all of which applications are hereby incorporated herein by reference in their entirety.

TECHNICAL FIELD

Embodiments of the invention relate to a level converter for converting a signal level of an input signal and for providing the converted input signal at an output terminal and a method to perform the conversion therewith.

BACKGROUND

Signal level converters are frequently used in electronic circuits to perform level conversion on logic signal levels from a circuit region supplied by a first supply voltage and to forward same to a circuit region supplied by another supply voltage. A conventional level converter, nowadays realized in common CMOS circuit technology, comprises two cross-coupled current paths with p-channel and n-channel field effect transistors connected in series.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

With reference to the accompanying FIGS. 1 to 11, explanations and embodiments relating to the level converter or level converter circuit and the method for converting the signal level of an input signal therewith will be described in detail.

Figure 1:
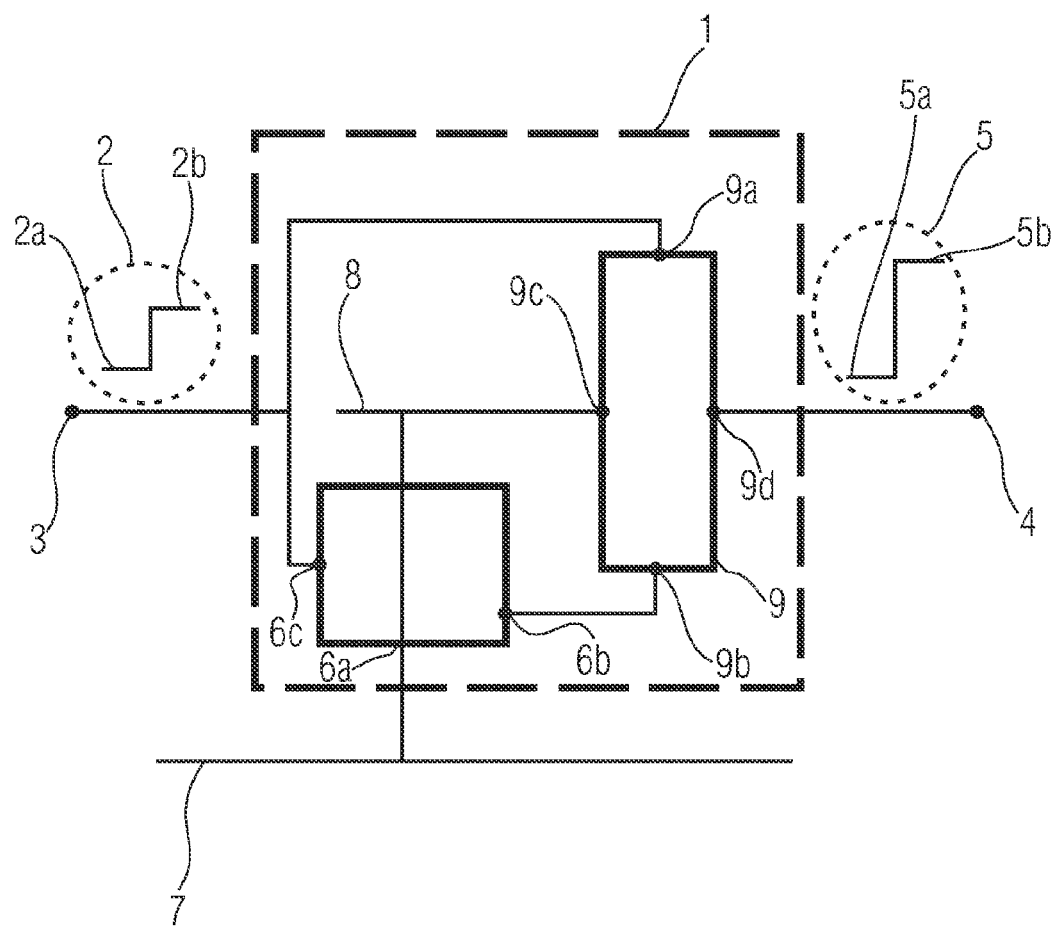
FIG. 1 shows a schematic block diagram of the level converter according to the invention.

FIG. 1 shows a schematic diagram of the inventive level converter 1, comprising a first signal level 2a of a main input signal 2 being able to assume the first and a second signal level at a main input terminal 3, for converting the first signal level 2a to a third signal level 5a at a main output terminal 4 to obtain a main output signal 5 being able to assume the third signal level 5a and the second signal level 5b. The level converter 1 comprises a latch 6a coupled between a control potential 8 and a potential 7 corresponding to the third signal level 5a. The latch 6a is controllable by the main input signal 2 to switch a latch output 6b between a control potential 8 and a potential 7 corresponding to the third signal level 5a. Moreover, the level converter 1 comprises an inverter 9 coupled between a terminal 9a, to which, depending on the main input signal 2, the first signal level 2a or the second signal level 2b is applied, and another terminal 9b connected to the latch output 6b. A signal input 9c of the inverter is coupled to the control potential 8 and a signal output 9d of the inverter 9 is coupled to the main output terminal 4.

At an input pad of a chip a logic signal level, for example, of 0V, representing a "low" level or a 3V signal, representing a "high" level may be applied. Exemplarily, the 0V or ground level may correspond to the first signal level 2a and the 3V "high" signal level may correspond to the second signal level 2b of the main input signal 2. An actual functional circuit, which is realized on the chip and is not shown in FIG. 1, may necessitate a voltage level of −3V and +3V. That means a level shifter circuit or a level converter would be needed in order to convert the 0V at the input pad of the chip to a signal level of −3V. However, the circuit exemplarily may only comprise transistors, which endure less than 3V, since the respective semiconductor process technology may provide no transistors with a higher electrical strength. That means the level converter may convert the "low" signal level from 0V to −3V by the exclusive use of metal-oxide-semiconductor (MOS) transistors, comprising a 3V endurance.

Figure 2:
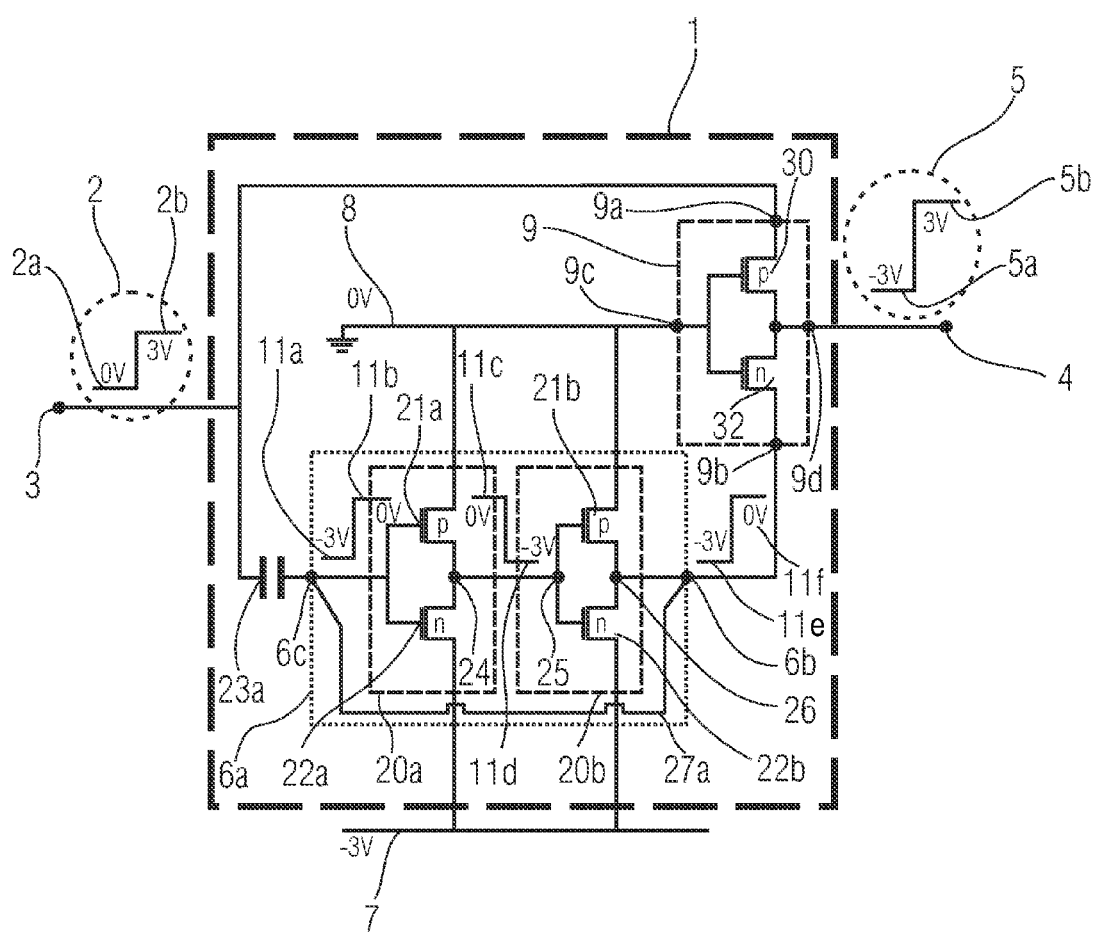
FIG. 2 shows a circuit diagram of a level shifter according to an embodiment of the invention.

FIG. 2 is a circuit diagram of a level converter according to an embodiment of the invention. Referring to FIG. 2, the level converter 1 comprises a main input terminal 3, with a main input signal 2, wherein the main input signal 2 comprises a first signal level 2a, in that case 0V and a second signal level 2b, in that case 3V.

The latch 6a comprises in this embodiment a first latch inverter 20a and a second latch inverter 20b connected in series. Each of them may comprise a p-channel transistor 21a and 21b and a n-channel transistor 22a and 22b, both being connected in parallel to each other. Each p-channel transistor having a first terminal connected to the control potential 8 and a second terminal connected to a first terminal of the n-channel transistor 22a, 22b respectively. The n-channel transistors 22a and 22b are connected in parallel to the corresponding p-channel transistors 21a, 21b. Such a pair of transistors 21a and 22a, 21b and 22b, respectively, are forming each a latch inverter, the first and the second latch inverter 20a and 20b. The second terminal of the n-channel transistors 22a, 22b are connected to the potential 7 corresponding to the third signal level 5a. That means the potential 7 should correspond to the signal level of the third signal level 5a of the main output signal 5 on the main output terminal 4 of the level converter 1.

The control terminals of the p-channel transistor 21a and the n-channel transistor 22b of the first latch inverter 20a are connected so that they form an input 6c of the latch 6a. The control terminals of the p-channel transistors 21b and the n-channel transistors 22b of the second latch inverter 20b are connected to the output node 24 of the first latch inverter 20a formed between the second terminal of the p-channel transistor 21a connected to the first terminal of the n-channel transistor 22a. The output node 26 of the second latch inverter 20b, formed between the second terminal of the p-channel transistor 21b and the first terminal of the n-channel transistor 22b, is connected to the latch output 6b. Furthermore, the latch may comprise a feedback loop 27a, formed by a connection between the latch input 6c and the latch output 6b.

A capacitor 23a may be assigned to the latch 6a so that, on the one hand, the capacitor 23a is coupled to the main input signal 2 and, on the other hand, to the input 6c and the output 6b of the latch 6a via the feedback loop 27a. The capacitor 23a may be used to control by changing the main input signal 2 to switch the latch output 6b between the control potential 8 and the potential 7 corresponding to the third signal level 5a. With a connection 27a between the latch output 6b and the latch input 6c, together with the capacitor 23a a feedback loop may be formed, which is triggered by a change of the main input signal 2.

An inverter 9 may be coupled between a first terminal 9a, to which, depending on the main input signal 2, a first signal level 2a or a second signal level 2b is applied and to the terminal 9b, which may be connected to the latch output 6b. Furthermore, a signal input 9c of the inverter 9 is connected to the control potential 8 and a signal output 9d of the inverter 9 is coupled or forms the main output terminal 4.

The inverter 9 may comprise a p-channel transistor 30 and a n-channel transistor 32, both being connected in parallel to each other. The p-channel transistor having a first terminal connected to the main input terminal 3, a second terminal connected to a first terminal of the n-channel transistor 32, which is connected in parallel to the p-channel transistor 30. The second terminal of the n-channel transistor 32 may be connected to the latch output 6b, wherein the control terminals of the p-channel transistor 30 and n-channel transistor 32 are connected to the control potential 8. The output 9d of the inverter 9 formed between the second terminal of the p-channel transistor 30 and the first terminal of the n-channel transistor 32 are connected to each other and coupled to the main output terminal 4 of the level converter 1.

Referring to FIG. 2, the operation of the level converter 1 will now be described. Applying the main input signal 2, which can change between the first signal level 2a and the second signal level 2b and vice versa, the capacitor 23a is charged. Depending whether a change from the first signal level to the second signal level takes place or vice versa, one of the two transistors 21a, 22a of the first latch inverter 20a is turned on and forms a conductive path between its two terminals, which leads to a potential at the output node 24 of the first latch inverter 20a, which corresponds to the respective potential 8 or 7. This is indicated in FIG. 2 by the signal levels 11c and 11d, wherein the "high" level corresponds now, for example, to 0V and the "low" level corresponds to the −3V of the potential 7. The signal levels 11c and 11d are applied at the input node 25 of the second latch inverter 20b. In the depicted example in FIG. 2, the control potential is 0V, also known as ground level and, as a consequence, for example, 0V is applied at the input node 25. Therefore the respective p-channel transistor 21b of the second latch inverter 20b is turned off and the respective n-channel transistor 22b is turned on. As a consequence the respective potential −3V 11e turns up at the output node 26. Thus, the input voltage level 0V has been changed to the respective −3V.

If the signal level of −3V is applied, at the input 25 of the second latch inverter 20b, the n-channel transistor 22b is turned off and the p-channel transistor 21b is turned on. As a consequence, the input signal of −3V is converted to 0V 11f. Because of the feedback loop 27a an equivalent signal levels 11e and 11f will reveal at the input node 6c of the latch 6a, leading to the depicted signal levels 11a and 11b. As described before, depending on the applied signal levels 11a or 11b, the first latch inverter 20a will invert the respective signal levels to the depicted signal levels 11c and 11d. By switching the main input signal 2 between the "low" level 2a and the "high" level 2b, which is via the capacitor 23a capacitively coupled to the latch 6a, a change of the signal level 11a and 11b is triggered and, as a consequence, the latched signal levels 11c, 11d and 11e and 11f are inverted.

The output signal 11e and 11f at the latch output 6b of the latch 6a is connected to the first terminal of the n-channel transistor 32 of the inverter 9. As depicted in FIG. 2, the control potential, in that case ground, is connected to the inverter input 9c and hence to the control terminals of the transistors 30, 32 of the inverter 9. The first terminal of the p-channel transistor 30 of the inverter 9 may be connected to the main input terminal 3. The main output terminal 4 and the respective main output signal 5, which comprises a second signal level 5b corresponding to the second input signal level 2b and a first signal level 5a of −3V, which is converted from 0V to −3V, is connected with the inverter output 9d. If the control potential 8 at the input 9c of the inverter 9 is 0V and the potential at the first terminal of the p-channel transistor 30 comes to the "low" level of the main input signal, e.g., exemplarily 0V 2a, the p-channel transistor 30 is turned off. If, at the same time, the potential at the inverter terminal 9b corresponding to the latch output 26, comes to −3V, the n-channel transistor 32 is turned on and the inverter output signal, the main output signal, respectively, appears to −3V 5a.

If the "high" signal level, e.g., exemplarily 3V, of the main input signal 2 is applied to the inverter terminal 9a and a potential of 0V to the inverter terminal 9b, the n-channel transistor 32 is turned off and the p-channel transistor 30 is turned on resulting in a potential at the inverter output 9d of 3V. That means depending on the applied voltage levels on the terminal 9a and 9b, together with the respective control potential 8, the transistors 30 and 32 can be alternatively turned on and off. A change of the signal levels at the terminal 9a and 9b should take place at the same time in order to insure that at least one of the transistors 30, 32 is shut down at any time to prevent a direct conductive path between the latch output 6b and the terminal 9a of the inverter 9. The control potential 8 might be 0V, the ground potential or may be also different to 0V, depending on the exact signal levels to convert and on the threshold voltage of the used p- and n-channel transistors 30, 32.

As it is shown in the above described embodiment, the main input signal 2 with a first signal level of 0V 2a and the second signal level of 3V 2b can be converted to the main output signal 5, comprising a third signal level of −3V, the converted first signal level 2a of the main input signal 2, and the unchanged second signal level 2b, 5b.

Figure 3:
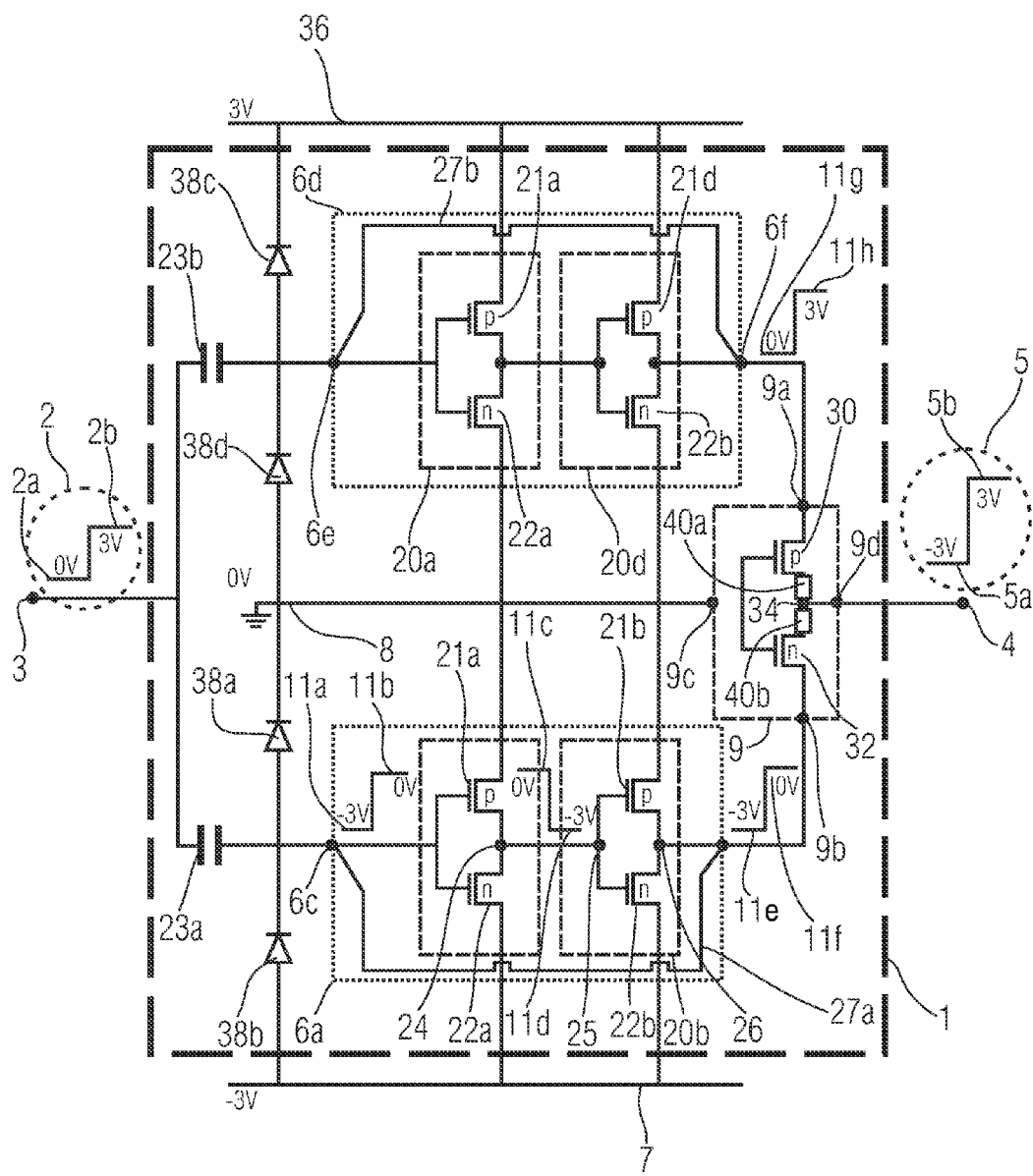
FIG. 3 shows a circuit diagram of a level converter according to another embodiment of the invention.

FIG. 3 refers to another embodiment of the invention. The level converter 1, or the respective level converter circuit comprises a second latch 6d, which is connected in parallel to the first latch 6a. The second latch 6d may comprise again two inverter latches 20a and 20b with the respective p- and n-channel transistors 21a, 22a, 21b, 22b, and the connections and terminals as described in FIG. 2. In contrast to the FIG. 2, there exists a potential 36 corresponding to the second signal level 2b, which is connected to the first terminals of the p-channel transistors of the first latch inverter 20a and the second latch inverter 20b of the second latch 6d. Contrary to the latch 6a, the second terminals of the n-channel latch inverter transistors of the second latch 6d are connected to the control potential 8. The control potential may be again 0 V. The main input signal 2 may in this embodiment be additionally coupled to the second latch 6d via a second capacitor 23b, being capacitively coupled to the second latch 6d in the above described way. That means one side of the capacitor is coupled to the main terminal input 3 and the other side of the capacitor is coupled to the control terminals of the p- and n-channel transistors 21a, 22a of the first latch inverter 20a of the second latch 6d.

As shown in FIG. 3, the input 6e and the output 6f of the second latch 6d may be connected in order to provide a feedback loop 27b for the second latch. The second latch 6d together with the latch 6a may prevent timing problems at the inverter 9 so that signal levels at the inverter terminal 9a and 9b are changed almost synchronously. In order to protect the inputs 6c and 6e of both latches 6a and 6d from an excess voltage, diodes 38a, 38b, 38c, 38d may be placed in parallel to the latch input nodes 6c and 6e. During the switch on phase of the level converter, there may be an excess voltage. The diodes 38a and 38b for the latch 6a and the diodes 38c and 38d for the second latch 6d are connected in parallel to the respective latch, wherein the blocking contact of the diode 38c is connected to the potential 36 and the anode of the diode 38d is connected to the control potential. In contrast to the diode 38c, the blocking contact of the diode 38a is connected to the control potential 8 and the anode of the diode 38b is connected to the potential 7 (see FIG. 3)

The output signal 11g or 11h of the second latch 6d is again generated by a two-fold inversion of the respective potential 36 and the control potential 8. In the described case, for example, 0V and 3V. Since the first latch 6a and the second latch 6d are controlled in parallel by the main input signal 2, which is capacitively coupled to the respective latches, the output signals 6b, 6f of the first and the second latch 6a, 6d should be synchronous. The output signal 11g and 11h at the latch output 6f of the second latch 6d is coupled to the first terminal of the p-channel transistor 30 of the inverter 9. The output signal 11e and 11f of the latch output 6b of the first latch 6a is coupled to the first terminal of the n-channel transistor 32 of the inverter 9. The control potential 8 may be again coupled to the control terminals of the p- and n-channel transistor 30, 32 of the inverter 9.

Moreover, resistances 40a, 40b between the second terminal of the p-channel transistor 30 and the inverter output node 34 and between the first terminal of the n-channel transistor 32 and the inverter output node 34 may be placed, in order to prevent an excess voltage and an excess current flow through the transistors 30 and 32. This might occur if the transitions between the signal levels 11g and 11h and between 11e and 11f do not take place synchronously.

The level converter 1 converts a first signal level 2a of a main input signal 2 being able to assume the first signal level 2a and a second signal level 2b at a main input terminal 3 to a third signal level 5b at a main output terminal 4 to obtain a main output signal 5, being able to assume the third signal level 5a and the second signal level 2b.

It is also feasible that the potential 36 is not corresponding to the second signal level 2b of the main input signal 2 and, instead, corresponds to a fourth signal level. That means that the output signal of the second latch 6d would comprise a signal level switching between the control potential 8 and the potential 36 corresponding to a fourth signal level. If the output signal of the first latch 6a is coupled to the inverter terminal 9b and the output signal of the second latch 6d is coupled to the terminal 9a of the inverter 9 and the control potential is applied to 9c, the main output signal 5 would then change between the third signal level 5a and a fourth signal level 5b corresponding to the potential 36.

The main input signal 2 with the first signal level 2a and the second signal level 2b can be changed then to a main output signal 5 with a third signal level 5a and a fourth signal level 5b, different to the second signal level 2b of the main input signal 2.

It should be noted that the exact signal levels can be shifted and adapted to the respective needs of a particular electrical circuit. Moreover, the conductivity types of the transistors may be reversed along with the connections to ground and to the respective potentials. Therefore, it is understood that variations and modifications of the described embodiments may be made without departing from the true spirit and scope of the invention.

It is also feasible that the control potential is corresponding to the first signal level or changed compared to the first signal level 2a depending on the threshold voltages of the transistors 30 and 32 and the inverter 9 so that by applying the control potential 8 to the control terminals of the transistors 30 and 32, it is still ensured that at least one transistor of both is turned off at any time during applying signals to the terminals 9a and 9b.

The level converter circuit may comprise a complementary-metal-oxide-semiconductor (CMOS) inverter whose input comprises 0V. At a terminal 3 a voltage VDD and a voltage VSS are synchronously switched from VDD=3V and VSS=0V to VDD=0V and VSS=−3V. The change of VSS from 0V to −3V is realized by a latch, which is controllable with the main input signal capacitively coupled by a capacitor to the latch.

The transistors used to form the level converter, as described above, may be fabricated within the same semiconductor technology and may, therefore, just endure a certain voltage level, for example, less than ±5V, ±3V or ±2V. They may be fabricated in an complementary-metal-oxide-semiconductor (CMOS) process. That means the electrical strength of the transistors may be, for example, up to ±5V, ±3V or ±2V.

Figure 4A:
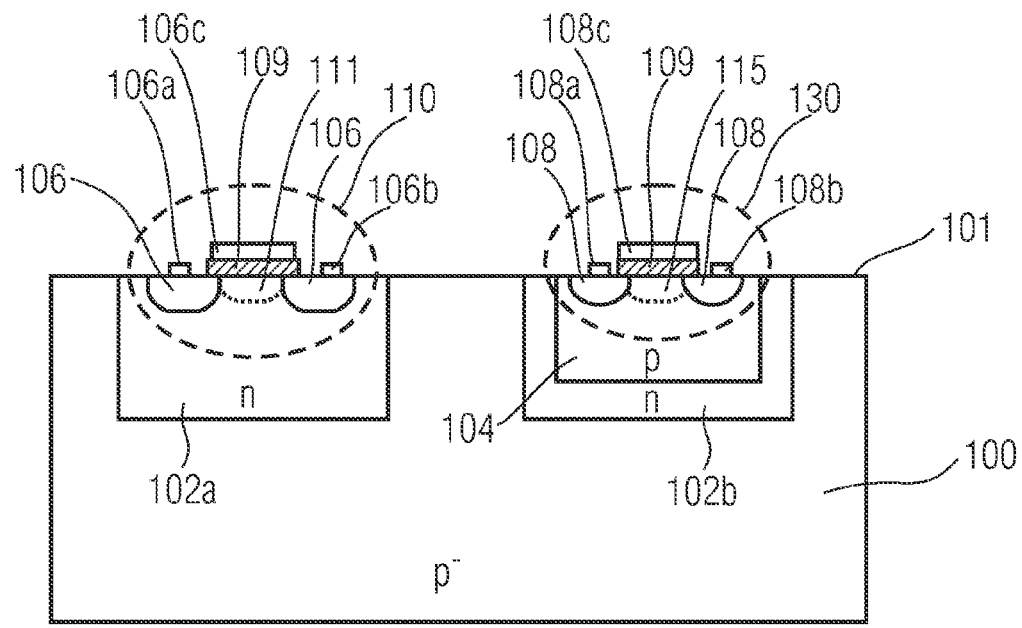
FIG. 4a shows a schematic cross section of a substrate comprising a p- and a n-channel transistor for the level converter of, for example, FIG. 1 or 3 in a double-well configuration.

As it is shown in FIG. 4a the respective p- (PMOS) and n-channel (NMOS) field effect transistors for forming the level converter may be formed in a double-well configuration. A semiconductor substrate 100 may be weakly p-doped (p⁻). A p-channel field effect transistor 110 formed in the substrate 100 with respect to a main substrate surface 101 comprises a first terminal 106a, a second terminal 106b and a control terminal 106c. The first terminal may be the source electrode of the transistor 110, the second terminal may be the drain electrode of the transistor and the control terminal may be the gate electrode of the transistor. It is also feasible, that the first terminal 106a is forming the drain electrode and the second terminal forms the source electrode. The first and the second terminals are formed by p-doped contact zones 106 in an n-well region 102a of the p⁻-doped substrate 100. The contact zones 106a, 106b may be heavily p-doped (p⁺). The control electrode 106c is formed above a gate dielectric 109, separating the gate electrode from the channel region 111 of the p-channel transistor 110. That means the channel region 111 may be a conductive path or a conductive channel between the source and drain contact region swichtable by the gate electrode. A respective n-channel transistor 130 for an inverter structure in the substrate is formed in a p-well zone 104, which is on its part formed in a n-well zone 102*b*, formed in the substrate 100. That means the NMOS transistor 130 is formed by a two-well or double-well process. The n-channel transistor 130 comprises a first terminal 108*a*, a second terminal 108*b* and a control terminal 108*c*. The first terminal may be the source electrode of the NMOS, the second terminal may be the drain electrode of the NMOS and the control terminal may be the gate electrode of the NMOS transistor. But it is also feasible, that the first terminal 106*a* forms the drain electrode and the second terminal 106*b* forms the source electrode. The first and the second terminals are formed by n-doped contact zones 108 in the p-well region 104, which is located in the n-well zone 102*b* of the of the p⁻-doped substrate 100. The n-well zones 102*a* and 102*b* may be separated. The control electrode 108*c* is formed above a gate dielectric 109, separating the gate electrode from the channel region 115 of the n-channel transistor 130. That means the n-channel region 115 may be a conductive path or a conductive channel between the source and the drain contact region, which is swichtable by the gate electrode 108*c*.

The n-well zones 102*a* and 102*b* can be merged to one n-well zone 102 (see FIG. 4*b*) or formed as one n-well zone 102, wherein the one n-well zone 102 comprises the PMOS transistor 110 and the p-well zone 104, with the respective NMOS transistor 130 as described in the context of FIG. 4*a*.

The conductivity type of the substrate, the different wells and the respective resulting transistors may be reversed. Therefore, it is understood that variations and modifications of the described embodiments may be made without departing from the true spirit and scope of the invention.

Figure 4B:
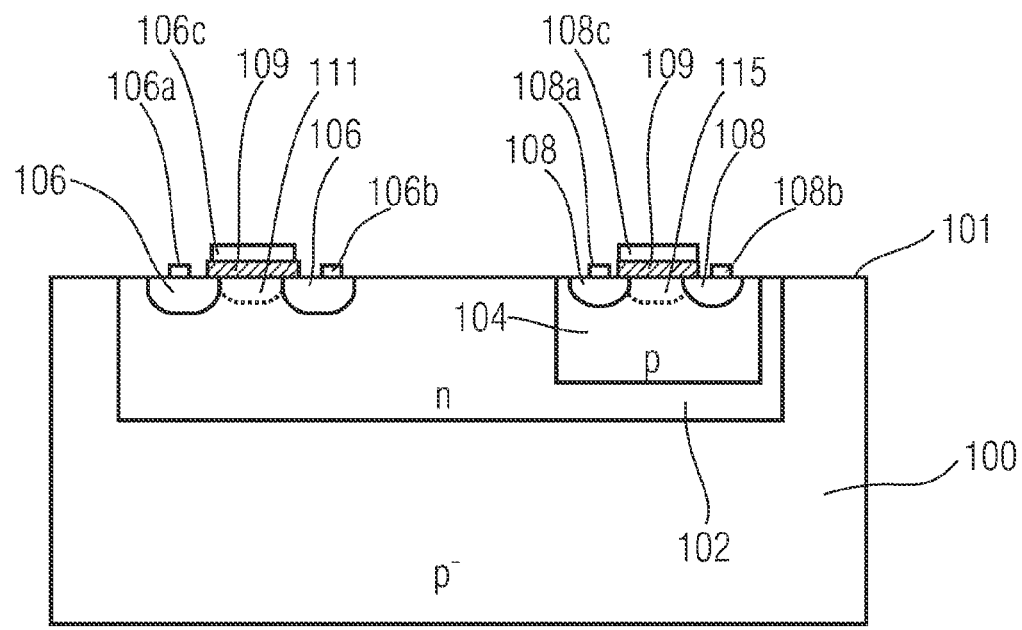
FIG. 4b shows another schematic cross section of a substrate comprising a p- and a n-channel transistor for the level converter of, for example, FIG. 1 or 3 in a double-well configuration.

Thus, as shown in FIG. 4*a* and FIG. 4*b*, one of, several of or all of the transistor pairs 21*a*/22*a*, 21*b*/22*b* and 30/32, may be implemented in the way shown in FIG. 4*a* and/or FIG. 4*b*, respectively.

In another embodiment an electrical circuit for converting a first signal level of a main input signal being able to assume the first and a second signal level at a main input terminal to a third signal level at a main output terminal to obtain a main output signal being able to assume the third signal level and the second signal level, the electrical circuit comprise means for providing an output signal switchable between a control potential, wherein the control potential is different to the second signal level of the main input signal and a potential corresponding to the third signal level depending on the main input signal, and means for providing the main output signal at the main output terminal depending on the main input signal, the control potential and the output signal.

In one embodiment of an electrical circuit as described above the means for providing the main output signal comprise an inverter coupled between a terminal, to which depending on the main input signal the first signal level or the second signal level is applied, and the output signal, a signal input of the inverter being coupled to the control potential and a signal output of the inverter being coupled to the main output terminal.

Figure 5:
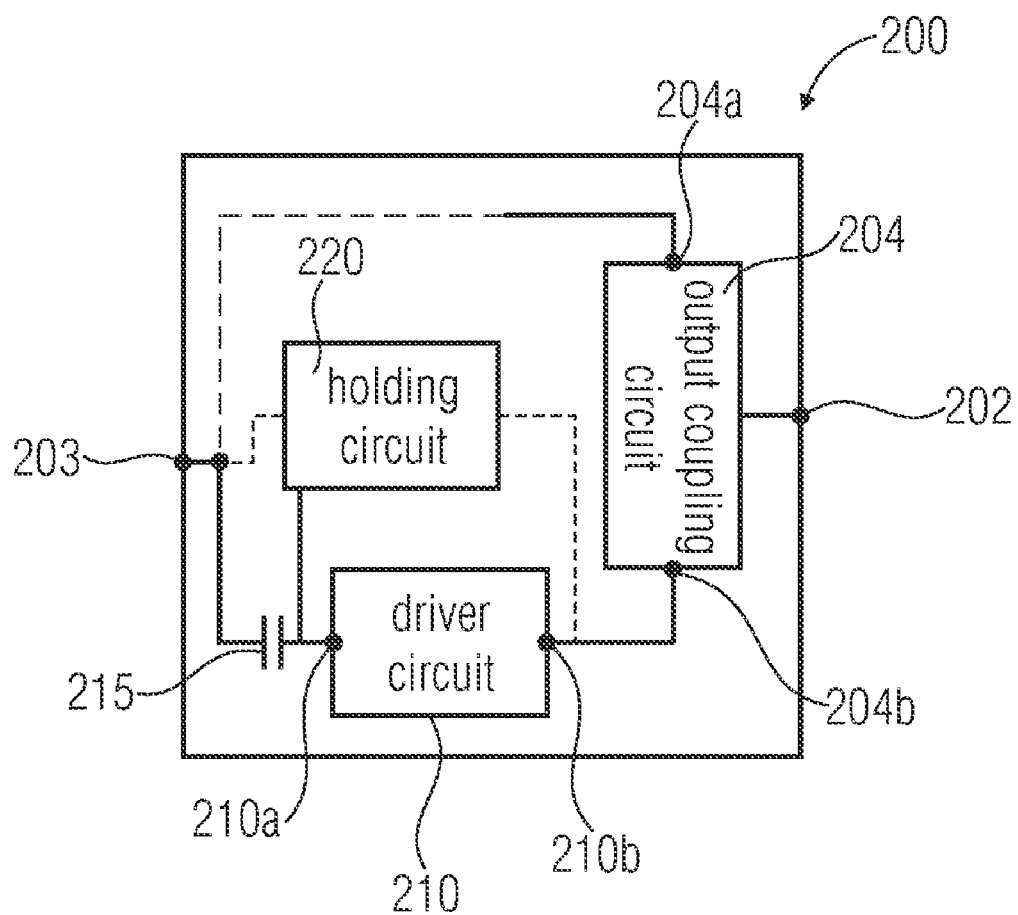
FIG. 5 is a schematic block diagram of a level converter with holding means according to a further embodiment.

FIG. 5 shows a further embodiment of a level converter. The level converter 200 may be formed to provide an output signal switchable between a first output signal level and a second output signal level at a circuit output 202 on the basis of an input signal present at an input. The level converter 200 may comprise an output coupling circuit 204 formed to receive a first partial output signal at a first output coupling circuit input 204*a* and a second partial output signal at a second output coupling circuit input 204*b*, and to couple the first partial output signal to the circuit output 202 if the first partial output signal has an active state, and to couple the second partial output signal to the circuit output if the second partial output signal has an active state. The level converter 200 may be formed to provide the first partial output signal so that the first partial output signal assumes two different signal levels depending on the state of the input signal. Furthermore, the level converter 200 may comprise a driver circuit 210, wherein the driver circuit may be formed to provide the second partial output signal so that the second partial output signal is switchable between two different signal levels depending on the state of the input signal. A level range between the two signal levels of the first partial output signal and a level range between the two signal levels of the second partial output signal may be shifted with respect to each other. Moreover, an input 210*a* of the driver circuit 210 may be capacitively coupled to the input 203 of the level converter 200 in order to allow for switching between the signal levels of the second partial output signal by the capacitive coupling in response to a change in the state of the input signal. This capacitive coupling may, for example, be achieved via a capacitor 215 connected between the input 203 of the level converter and the input of the driver circuit 210. The level converter 200 may comprise holding means 220 (also referred to as holding circuit) formed to keep the state of the second partial output signal constant (or stabilize it) in the case of a constant state of the input signal.

There are a variety of possible realizations for the holding means. The holding means may, for example, be connected between the input of the level converter and the input of the driver circuit 210 in order to stabilize the driver circuit by forward coupling, in parallel to the capacitive coupling, in a stationary state. The holding means may, however, alternatively (or even additionally) also be coupled between the driver circuit input 210*a* and the driver circuit output 210*b* so as to stabilize the state of the driver circuit by feedback.

Figure 6:
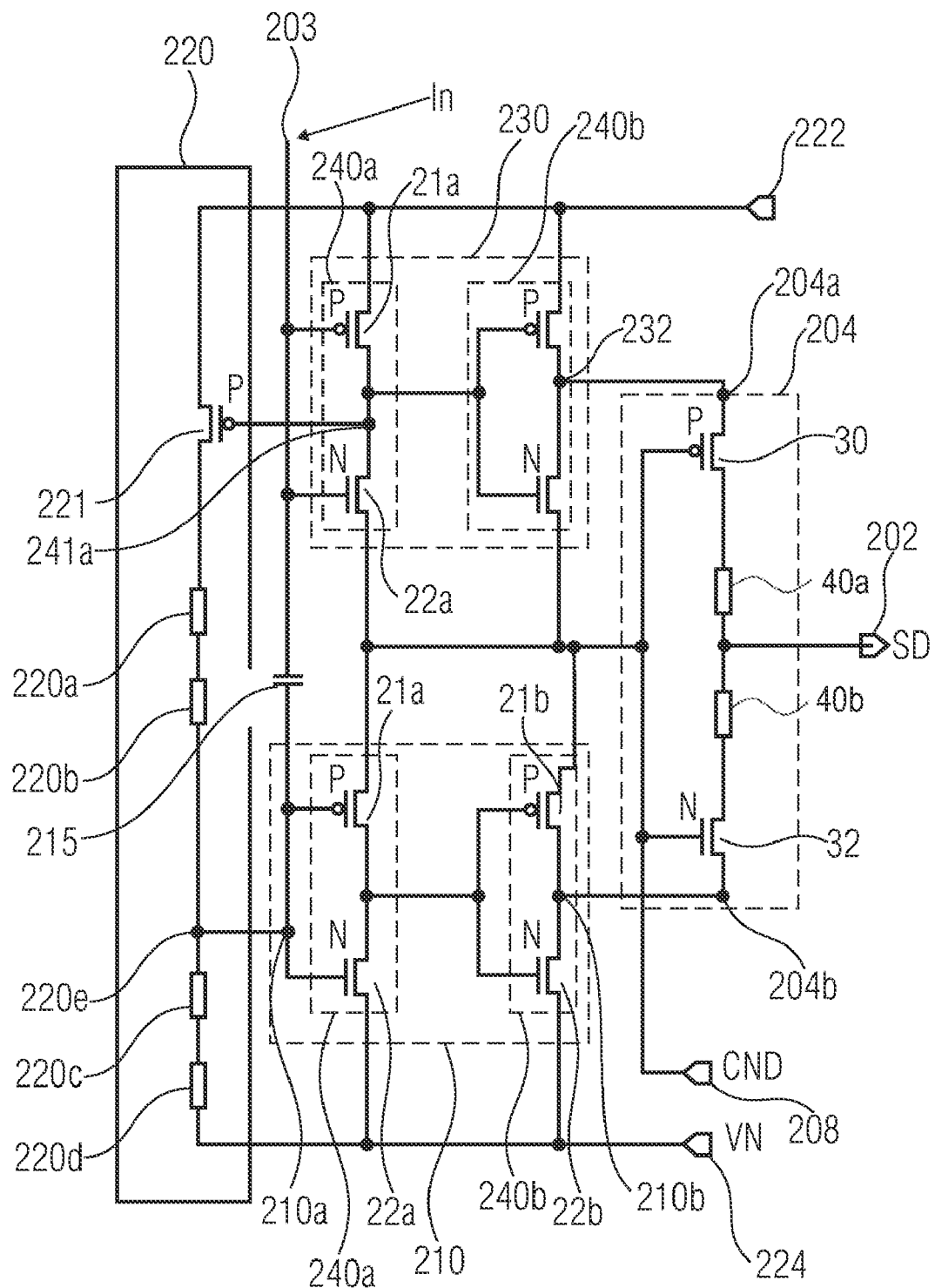
FIG. 6 is a circuit diagram of a level converter with a voltage divider made of resistors as holding means according to an embodiment.

FIG. 6 shows an embodiment of a level converter 200 comprising an input 203, a circuit output 202, an output coupling circuit 204 with the output coupling circuit inputs 204*a* and 204*b*, a driver circuit 210 with a driver circuit input 210*a* and a driver circuit output 210*b*, holding means 220, as well as a coupling capacitance 215 connected between the input 203 of the level converter 200 and the input of the driver circuit 210. Furthermore, the level converter may (optionally) comprise a driver stage 230 (for example, in the form of an inverter stage) connected between the input 203 and the first output coupling circuit input 204*a*.

The level converter 200 also comprises a control or reference potential terminal 208, a first conversion potential terminal or supply potential terminal 222, and a second conversion potential terminal or supply potential terminal 224. The level converter 200 may be a static level converter.

In the following, at first the output coupling circuit 204 will be described. The output coupling circuit 204 may comprise an inverter structure, in some embodiments. Correspondingly, the output coupling circuit 204 with the inverter structure may comprise a p-channel transistor 30 and an n-channel transistor 32, wherein a first terminal (source terminal) of the p-channel transistor 30 is connected to the first output coupling circuit input 204*a*, and wherein a first terminal (source terminal) of the n-channel transistor is connected to the second output coupling circuit input 204*b*.

The second terminal of the p-channel transistor 30 (drain terminal) and the second terminal of the n-channel transistor 32 (drain terminal) are coupled to the circuit output 202 via resistors 40*a* and 40*b*, in this embodiment. A control potential or reference potential present at the control potential terminal or reference potential terminal 208 may be present at the gate terminals or control terminals of the p-channel transistor 30 and of the n-channel transistor 32 of the inverter structure.

The control potential may be a ground potential or reference potential (also referred to as "ground potential"). Thereby, depending on the level of a first partial output signal present at the first output coupling circuit input 204a and a second partial output signal present at the second output coupling circuit input 204b, one of the two transistors 30, 32 may become conducting, and the corresponding partial output signal thus may be coupled to the circuit output 202. If the first partial output signal has an active state (i.e., lies sufficiently far above the reference potential, for example), the first partial output signal may be coupled to the circuit output 202, and if the second partial output signal has an active state (i.e., lies sufficiently far below the reference potential, for example), the second partial output signal may be coupled to the circuit output 202.

For example, a first partial output signal, which is present at the first output coupling circuit input 204a and has a level range of 3V, e.g., between a first signal level of 0V (with respect to the reference potential present at the terminal 208) and a second signal level of +3V, may be coupled to the circuit output 202 in an active state. In the active state, +3V then are present at the first terminal (source terminal) of the p-channel transistor 30, for example, while the 0V of the reference potential is present at the corresponding gate terminal. Thus, the p-channel transistor 30 is conducting, and the first partial output signal of +3V is coupled to the output 202 via the drain-source path of the p-channel transistor 30, so that a level of about +3V is available at the output 202 of the level converter. In the inactive state of the first partial output signal, however, 0V is present at the first terminal (source terminal) of the p-channel transistor 30, so that the transistor blocks or is non-conducting at a gate voltage of 0V (as far as it is an enhancement type). Hence, the corresponding second (inactive) signal level of the first partial output signal is not coupled to the output 202. Correspondingly, with an inactive first partial output signal, an (active) signal level of the second partial output level, which is present at the second output coupling circuit input 204b, can be coupled to the circuit output 202 via the n-channel transistor 32.

For example, the second partial output signal may be switchable between signal levels of 0V and −3V, wherein the active state of the second partial output signal corresponds to the signal level of −3V, and wherein the inactive state of the second partial output signal corresponds to the signal level of 0V. If the −3V are present at the second output coupling circuit input 204b, for example, the n-channel transistor 32 becomes conducting, and the second partial output signal is coupled to the circuit output 202.

The active signal level of the first active partial output signal may correspond to the potential of the first supply potential or conversion potential 222, and the active signal level of the second partial output signal may correspond to the potential of the second conversion potential or supply potential 224. Correspondingly, the first output signal level of the output signal may approximately correspond to the potential of the first conversion potential 222, and the second output signal level 224 to the potential of the second conversion potential 224. In the above example, the first output level may thus be about 3V, and the second output level about −3V, for example.

In the following, the driver stage or inverter stage 230 will be described. The driver stage or inverter stage 230 may consist of two inverter structures 240a and 240b connected in series (or comprise at least two inverter structures 240a, 240b). The inverter structures 240a, 240b, for example, are connected in series between the input 203 and the first output coupling circuit input 204a in order to provide the first partial output signal at the first output coupling circuit input, depending on the input signal present at the input 203.

First terminals (source terminals) of the p-channel transistors 21a, 21b of the inverter structures 240a, 240b are connected to the first conversion potential 222. First terminals of the n-channel transistors 22a, 22b are coupled to the terminal 208 for the control potential or reference potential. The respective second terminals (drain terminals) of the p- and n-channel transistors 21a, 22a, 21b, 22b are connected to each other and each form an output node of the inverter structures, as already described above. The output node of the first inverter structure 240a is connected to the input node of the second inverter structure 240b. At the output 232 of the second inverter structure 240b, the first partial output signal can be provided, which is present at the first output coupling circuit input 204a of the output coupling circuit 204.

In the following, the driver circuit 210 as well as its coupling to the input of the level converter 200 will be described. An input signal from the input 203 of the level converter may be capacitively coupled to the input 210a of the driver circuit 210 via a capacitor 215.

The driver circuit 210 with the driver circuit input 210a and the driver circuit output 210b may, for example, comprise two inverter structures 240a and 240b connected in series, which are connected between the input of the driver circuit 210 and the second output coupling circuit input 204b. Hence, the driver circuit as a whole is designed to provide the second partial output signal at the second output coupling circuit input on the basis of the signal present at the input of the driver circuit.

The inverter structures 240a and 240b, for example, are constructed as CMOS inverter structures and, for example, include a p-channel transistor 21a, 21b and an n-channel transistor 22a, 22b each. Supply voltage terminals of the CMOS inverter stages 240a, 240b are, for example, coupled to the reference potential terminal 208 and the second supply potential terminal 224, so that, depending on the input signal of the driver circuit, an output 210b of the second inverter stage 240b is coupled to the reference potential at the second supply potential.

A first terminal (source terminal) of the p-channel transistor 21a of the inverter stage 240a and a first terminal of the p-channel transistor 21b of the inverter stage 240b are coupled to the control potential terminal 208. A first terminal (source terminal) of the n-channel transistor 22a of the inverter stage 240a and a first terminal of the n-channel transistor 22b of the inverter stage 240b are coupled to the terminal for the second conversion potential 224. The respective second terminals (drain terminals) of the p-channel transistors and n-channel transistors of the inverter structures 240a and 240b are connected to each other and each form the output nodes of the inverter structures. The output node of the first inverter structure 240a is connected to the input node of the second inverter structure 240b. At the output 210b of the driver circuit, which may be identical with the output node of the second inverter structure 240b, the second partial output signal may be provided with the aid of the inverter structure 240a, 240b, wherein the second partial output signal may be switched between two different signal levels depending on the state of the input signal. These signal levels may be coupled to the second output coupling circuit input 204b as a second partial output signal. The signal levels may correspond to the second supply potential 224 and the reference potential 208.

By way of the capacitive coupling of the input signal via the capacitor 215 to the driver circuit (or to the input 210a thereof), quick switching between the first and second signal levels at the second output coupling circuit input 204b can be made possible. The coupling via the capacitor or the capacitance 215 thus represents a quick coupling path between an input signal at the input 203 of the level converter and the driver circuit 210. Additionally, the capacitive coupling between the input 203 of the level converter and the input 210a of the driver circuit 210 allows for a shift between the direct voltage level of the input signal present at the input 203 and the direct voltage level of the input signal present at the input 210a of the driver circuit. Hence, the signal at the input 210a of the driver circuit 210 may be shifted as a whole in potential with respect to the input signal at the input 203. Thereby, it may be achieved that the respective transistors are loaded with lower voltages. Thus, for example, the potentials present at the gate terminals of the transistors of the driver circuit 230 may vary between the reference potential and the first supply potential. Furthermore, the potentials present at the gate terminals of the transistors of the driver circuit 210 may vary between the second supply potential and the reference potential. Hence, the capacitive coupling allows for separation of the direct voltage levels between the inputs of the driver circuit 210 and of the driver circuit 230, whereby a voltage load of the input stages of the driver circuits 210, 230 is kept sufficiently small.

A second, albeit slower, forward coupling is given by the holding means 220. The holding means 220 is formed to keep a state of the second partial output signal constant at a constant state of the input signal. The holding means 220 may thus make the state of the output signal of the driver circuit 210 correspond to a desired state even if no change in the state at the input 203 of the level converter 200 occurs for a longer period of time. The holding means thus serves to stabilize the state of the driver circuit in a static case of operation. The holding means may further serve to balance possible signal level disturbances at or in the driver circuit 210, i.e., stabilize the state of the driver circuit.

The holding means 220 in the embodiment of FIG. 6 comprises a resistive voltage divider, which can be switched on and off via a p-channel transistor 221. The p-channel transistor 221 acts as a switch. The corresponding gate terminal or control terminal of the transistor 221 is connected to the output node 241a of the first inverter structure 240a of the driver stage 230. Thus, the transistor 221 is switched on or off depending on the input signal of the level converter. The voltage divider thus is switched in or switched on, or switched away or switched off. The holding means 220 may be coupled between the first conversion potential or supply potential 222 and the second conversion potential or supply potential 224 and comprises several resistors 220a, 220b, 220c and 220d connected in series in the embodiment of FIG. 6. For example, the resistors are connected in series with the load path (drain-source path) of the transistor 221 between the terminal for the second supply potential and the terminal for the first supply potential.

A tap 220e of the voltage divider or a voltage divider node 220e between the resistors 220b and 220c is connected to the input 210a of the driver circuit. Hence, the input 210a of the driver circuit is connected to the terminal 224 for the second supply potential via a resistor or a series connection of several resistors 220c, 220d. Furthermore, the input 210a of the driver circuit is connected to the terminal 222 for the first supply potential via a series connection including one or more resistors 220a, 220b and the load path of the transistor 221.

Hence, the input 210a of the driver circuit 210 can be drawn to the second supply potential by the voltage divider if the transistor 221 is switched off or non-conducting. Furthermore, the input 210a of the driver circuit 210 can be drawn to an intermediate potential, which lies between the first supply potential and the second supply potential, by the voltage divider if the transistor 221 is switched on or conducting. The intermediate potential is dependent on the resistances of the resistors 220a-d and on the present first and second supply potentials or conversion potentials.

The resistors may be high-ohmic resistors, so that a minimum quiescent current may flow between the first 222 and second 224 supply potentials via the resistors and the transistor 221. A state of the driver circuit 210 may be held via the voltage divider 220, as will be explained in the following.

If the transistor 221 is conducting when a first input signal state is present, e.g., if a voltage level of 3V is present at the input 203, the n-channel transistor 22a of the driver stage 230 becomes conducting. Thereby, the p-channel transistor 221 of the holding means 220 also becomes conducting, because the reference potential, here, e.g., ground potential, is present at the control terminal (gate) of the transistor 221, while the first conversion potential 222 of, for example, 3V is present at the source terminal of the transistor 221. Assuming that the resistances of the resistors 220a and 220b and the resistances of the resistors 220c and 220d yield the same overall resistance, and that a potential of −3V is given at the terminal 224 for the second conversion potential, a voltage equilibrium state of approximately 0V results at the tap of the voltage divider 220e, and hence at the input 210a of the driver circuit 210. Through this effect of the holding means, the potential at the input 210a of the driver 210 can be stabilized when a static input signal is present at the input 203 of the level converter.

If the transistor 221 is not conducting when a second input signal state of the input signal of, e.g., 0V is present, no voltage drops at the resistors 220c and 220d, because no significant current flows through the voltage divider. The second conversion potential of, e.g., −3V hence is present at the input 210a of the driver circuit 210. Through this effect of the holding means, a second signal level of, e.g., −3V at the driver output 210b can be stabilized or kept constant when a static input signal is present at the input 203 of the level converter.

In the level converter 200, there is task sharing among the capacitive coupling by means of the coupling capacitor 215 and the holding means 220. In this respect, it is to be taken into account that the input 210a of the driver circuit 210 comprises a parasitic capacitance (for example, induced by gate-drain capacitances and gate-source capacitances of the transistors 21a, 22a). This parasitic capacitance limits the speed with which the potential present at the input 210a can be changed. When the state of the input signal at the input 210a changes, the parasitic input capacitance is reloaded more quickly, the more current is made available to the input 210a for reloading the parasitic capacitance.

In one embodiment, the coupling capacitor 215 and the holding means 220 are dimensioned such that the coupling capacitor provides significantly more current (for example, at least 5 times more current, or at least 10 times more current, or even 100 times more current) in magnitude to the input 210a of the driver circuit 210 than the voltage divider, when the state of the input signal present at the input 203 changes. In other words, the input current needed for changing the state of the driver circuit 210 is largely provided via the coupling capacitor 215, due to corresponding circuit dimensioning. The holding circuit 220, however, is intentionally dimensioned to be high-ohmic in order to keep quiescent current consumption low. While only a very slow change of the potential at the input 210a thus could be caused by the holding means alone (without the aid of the coupling capacitor), the capacitive coupling by the capacitor 215 allows for a quick change of the potential at the input 210a in response to a change in the input signal at the input 203 of the level converter.

In a static state, however, which means when a constant state is present at the input 203 of the level converter, the capacitor 215 only provides a negligible current to the input 210a. Nevertheless, due to external spurious influences or due to leakage currents, it may happen that the potential at the input 210a shifts slightly and/or can only be kept constant by a flow of current. In the static state, however, the holding means, as a high-ohmic voltage source, provides a current causing potential changes at the input 210a due to spurious influences to be cancelled, and the influence of leakage currents (which are clearly lower than the current provided by the holding means) to be largely eliminated.

In other words, a change of the input signal state (at the input 203) is transferred to the driver circuit via the quick capacitive coupling to the capacitor 215, and the new signal level resulting therefrom at the driver circuit output 210b can be stabilized via the voltage divider circuit 220.

According to an embodiment, the level converter 200 may provide an output signal at the circuit output 202, which is switchable between a first and a second output signal level, by selectively applying a first and a second input signal state. The first and the second output signal level may correspond to the first conversion potential 222 and the second conversion potential 224.

These signal levels may be connected or applied to the output coupling circuit 204 by the inverter stage 230 (first partial output signal) on the one hand and by the driver circuit 210 (second partial output signal) on the other hand, wherein the input signal 210a of the driver circuit 210 is changed substantially by the quick capacitive coupling via the capacitor 215 in the case of a change of state and kept stable substantially by the forward coupling via the holding means 220 in the stationary case. The output coupling circuit may be formed to couple the respective partial output signal currently in an active state to the output 202.

By using the coupling capacitor 215, it may further be ensured that a maximum voltage drop across a transistor of the circuit does not exceed a maximum value determined by the first and second conversion potentials. For example, it may thus be avoided that a gate-source voltage of more than 3V in magnitude is present at a transistor, for example, if the first conversion potential is +3V (with respect to the reference potential), and if the second conversion potential is −3V (with respect to the reference potential). For this reason, the level converter may be produced completely, e.g., in CMOS technology, wherein transistors with comparably low breakdown voltage may be employed.

That means, while the flip-flop is held via the feedback in the case of the circuit according to FIGS. 2, 3 and 4, it is held in the respective state via a voltage divider in the case of the circuit according to FIGS. 6, 7, 8 and 9. Hence, the circuit according to FIGS. 2, 3 and 4 can be modified with respect to holding the driver circuit, in order to obtain the circuit according to FIGS. 6, 7, 8 and 9. Instead of a feedback for stabilizing the state of the driver circuit, the circuit according to FIGS. 6, 7, 8 and 9 uses feed-forward. The circuitries according to FIGS. 6, 7, 8, 9 are in some cases more stable with respect to external influences than the circuitries according to FIGS. 2, 3 and 4. Good results may, however, also be achieved with the circuitries according to FIGS. 2, 3 and 4.

The static level shifter or level converter according to FIG. 6 thus resembles the static level shifter or level converter according to FIG. 3. However, the diodes 38 and the capacitor 23b of the level converter according to FIG. 3 are missing in the level converter according to FIG. 6. The flip-flop (or the driver circuit 210) is not held via the feedback 27a, 27b, but via the voltage divider 220 in the circuit according to FIG. 6. The voltage divider is switched on and off via the p-MOS 221.

Figure 7:
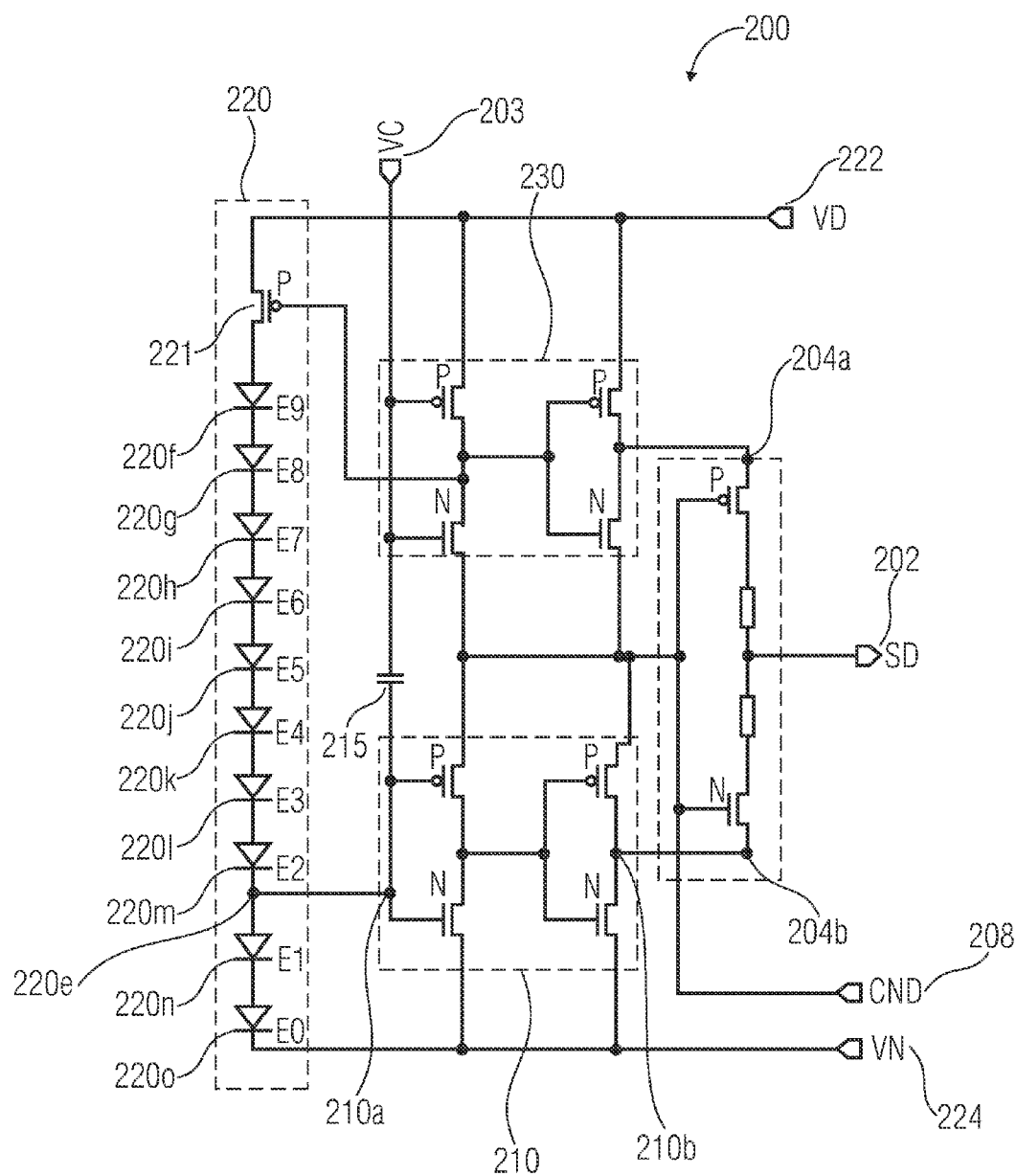
FIG. 7 is a circuit diagram of a level converter with a voltage divider made of diodes as holding means according to an embodiment.
Figure 8:
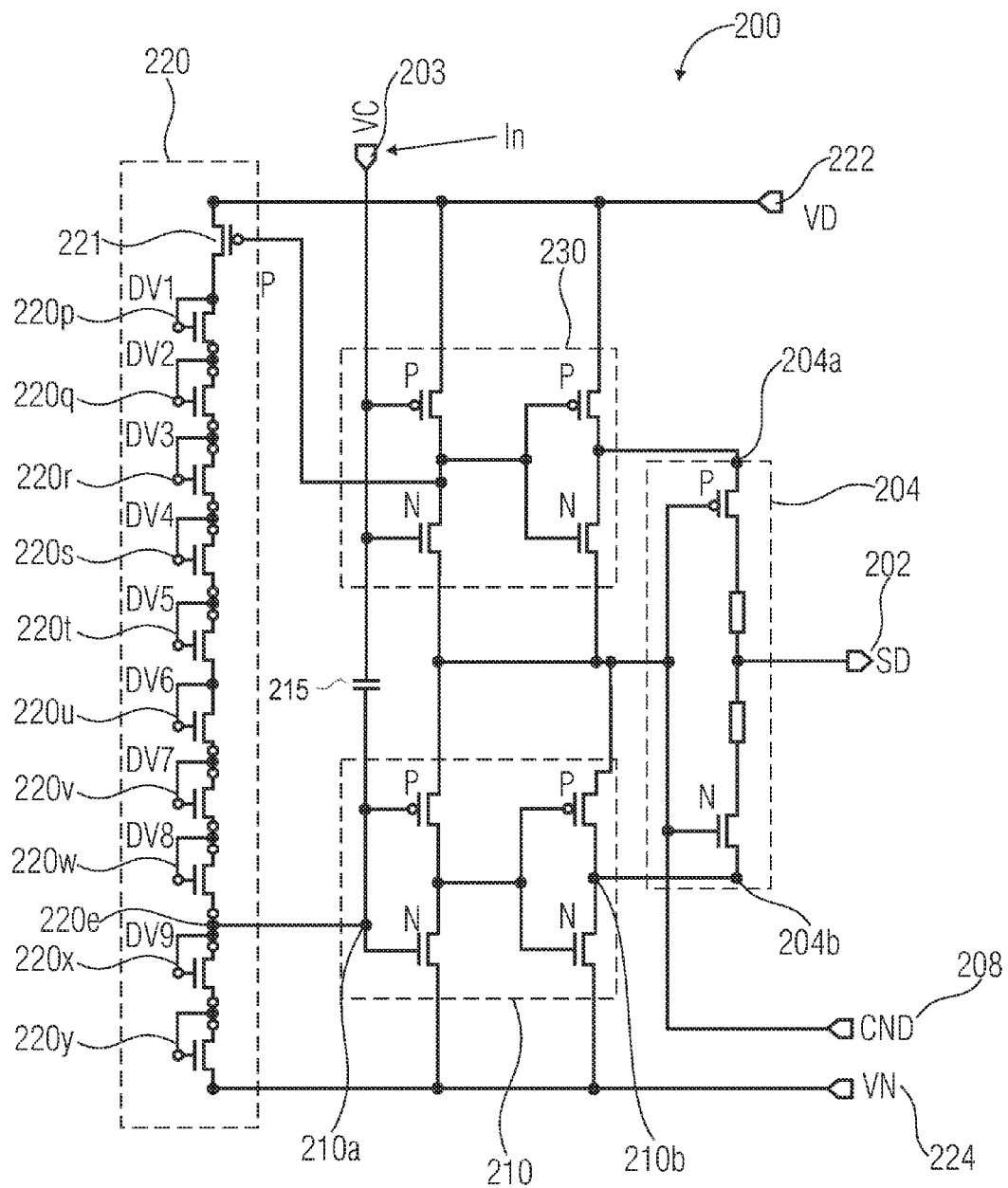
FIG. 8 is a circuit diagram of a level converter with a voltage divider made of transistors connected as diodes according to an embodiment.
Figure 9:
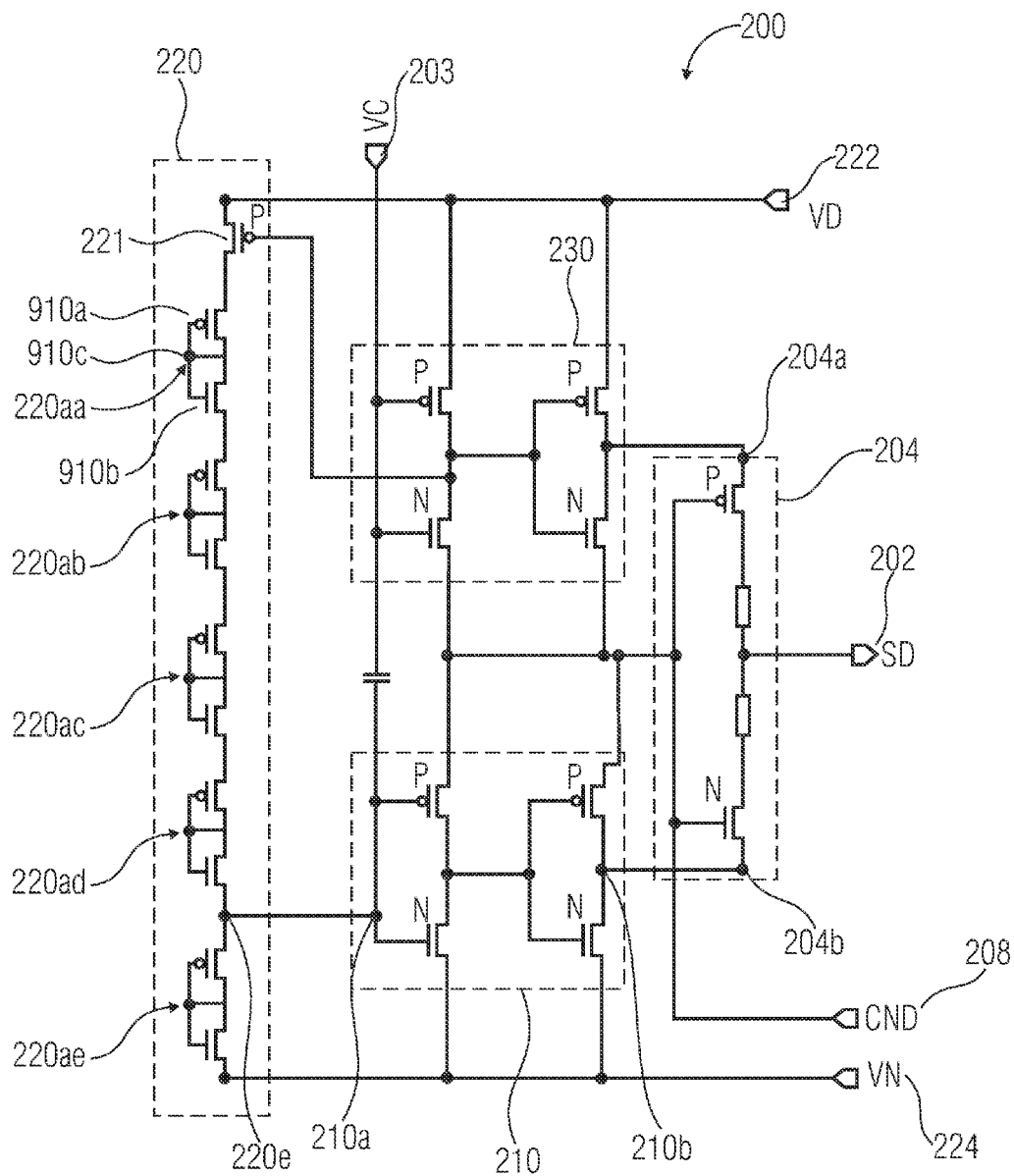
FIG. 9 is a circuit diagram of a level converter with a voltage divider realized by NMOS and PMOS transistors connected as diodes according to an embodiment.

FIGS. 7, 8 and 9 show further embodiments of level converters 200 constructed in a similar way to the level converter in FIG. 6. For this reason, repeated detailed description of the functioning of the individual assemblies will be omitted in the following, with reference being made to the corresponding description in FIG. 6 in this respect.

The level converter 200 according to FIG. 7 again comprises a circuit input 203, a circuit output 202, an output coupling circuit 204 with the output coupling circuit inputs 204a and 204b, a driver circuit 210 with a driver circuit input 210a and a driver circuit output 210b, holding means 220, as well as a coupling capacitance 215 connected between the input 203 of the level converter 200 and the driver circuit 210. The level converter comprises an inverter stage 230 connected between the input 203 of the level converter and the first output coupling circuit input 204a. Furthermore, the level converter comprises terminals or feeds for a reference potential or control potential 208, a first conversion potential 222 and a second conversion potential 224.

The holding means 220 in this embodiment again comprises a resistive voltage divider, but with the voltage divider being realized by diodes (or using diodes) in this embodiment. The voltage divider includes a series connection of the diodes 220f-220o, wherein the diodes are each connected in series in the same orientation, so that the cathode of a previous diode is connected to an anode of a subsequent diode each. A first end of the series connection (cathode of the diode 220o) is coupled to the terminal 224 for the second supply potential. A first end of the series connection (anode of the diode 220f) is coupled to the terminal 222 for the first supply potential via a load path (drain-source path) of the p-channel field effect transistor. A voltage divider node, which means a tap between two of the series-connected diodes 220f-220o, is coupled to the input 210a of the driver circuit 210.

With the aid of the p-channel transistor 221, which again serves as a switch, the diodes 220f-220o can be switched in, so that current may flow in a forward direction through the series connection of the diodes. Hence, a voltage drop at the diodes results, and a voltage equilibrium value may develop at the voltage divider node 220e. If the p-channel transistor is switched off or non-conductive, however, only a negligible residual current flows through the diodes 220f-220o, and the voltage divider node 220e is drawn toward the second supply potential.

Thereby, a state of the driver circuit 210 can be kept constant or stabilized when the input signal is unchanged, as described above. In the switched-off state of the transistor 221, the input 210a of the driver circuit 210 is drawn toward the second supply potential and, in the switched-on state of the transistor 221, the input 210a of the driver circuit 210 is drawn to a potential between the first supply potential and the second supply potential, which is determined substantially by the number of diodes between the voltage divider node and the terminals 222, 224 for the supply potentials. Between which ones of the diodes 220f-220o the voltage divider node 220e or the tap is arranged depends on the voltage drop at the diodes and the desired signal value at the driver circuit input 210a, among other things.

The quick dynamic coupling between the input 203 of the level converter and the input 210a of the driver circuit, which is effective in the case of a change in the input signal level, again takes place via the capacitance 215.

Hence, the voltage divider is realized by diodes in the level converter according to FIG. 7.

FIG. 8 shows a further embodiment of a level converter. In this embodiment, a level converter 200 comprises an input 203, a circuit output 202, an output coupling circuit 204 with the output coupling circuit inputs 204a, 204b, a driver circuit 210 with the driver circuit input 210a and the driver circuit output 210b, holding means 220, as well as a coupling capacitance 215 connected between the input 203 of the level converter 200 and the input 210a of the driver circuit 210. The level converter further comprises an driver stage 230 connected between the input 203 and the first output coupling circuit input 204a, as well as terminals for a reference potential or control potential (terminal 208), a first conversion potential (terminal 222) and a second conversion potential (terminal 224).

The holding means 220 in this embodiment includes a series connection of NMOS transistors 220p-220y connected in series as resistors and/or as diodes. To this end, a first terminal (drain terminal) of the NMOS transistor is connected to its control terminal (gate terminal) each, in order to effectively form an anode terminal. A second terminal (source terminal) of the transistor effectively forms a cathode terminal.

The channel paths of the transistors 220p-220y thus are connected in series. Otherwise, the transistors are connected so that the corresponding diode structures of the transistors are connected in a forward direction. The switch 221, i.e., the p-channel transistor 221, again serves for switching the resistive voltage divider on or off.

In summary, it may thus be stated that the circuit according to FIG. 8 is substantially different from the circuit according to FIG. 7 in that the diodes 220f-220o are replaced by transistors (here: MOS field effect transistors) connected as diodes. In other words, in the static level converter according to FIG. 8, the voltage divider is realized by n-MOS transistors connected as diodes.

As a further embodiment, FIG. 9 shows a level converter 200 in which the holding means 220 is again realized by a voltage divider.

In this embodiment, the voltage divider is formed by NMOS and PMOS transistor pairs 220aa-220ae, which may again be switched in via a switch 221, which may be formed as a p-channel transistor. Generally speaking, in the level converter according to FIG. 9, the voltage divider is realized by nMOS and pMOS transistors connected as diodes.

In the following, one of the PMOS-NMOS transistor pairs, namely the transistor pair 220aa, will be described as an example. An NMOS-PMOS transistor pair each includes a PMOS transistor and an NMOS transistor. A drain terminal of the PMOS transistor 910a here is connected to a drain terminal of the accompanying NMOS transistor 910b at a common intermediate node 910c (for example, directly). Moreover, a gate terminal of the PMOS transistor 910a is connected to the common intermediate node 910c (for example, directly). Likewise, a gate terminal of the NMOS transistor 910b is connected to the common intermediate node 910c (for example directly). A source terminal of the PMOS transistor 910a thus effectively serves as an anode terminal of the transistor pair 220aa, and a source terminal of the NMOS transistor 910b effectively serves as a cathode terminal of the transistor pair 220aa. The PMOS and NMOS transistor pairs connected in series thus are connected so that an effective diode structure results. The transistor pairs 220aa-220ae may thus take the place of the diodes 220f-220o or of the single transistors 220p-220y connected as diodes. By using this transistor structure, which may usually be produced in a CMOS process, using resistors which necessitate a relatively high amount of space on an integrated circuit in some technologies can be avoided.

Here, it is to be considered, of course, that the voltage drop across the transistor pairs may be different from the voltage drop across a single diode or across a single transistor. The arrangement of the voltage divider node 220e again depends on the potentials 222 and 224, as well as the voltage drop at the diode structures of the PMOS and NMOS transistors.

The circuits according to FIGS. 6-9 merely are to be regarded as examples of realization and may, of course, be modified significantly. For example, the inverter stage 230 may optionally be omitted. The input 203 may, for example, be directly connected to the first input 204a of the output coupling circuit 204, as this is shown in a similar way in the circuit according to FIG. 2. Thus, it is sufficient for the level converter to be formed so that the first partial output signal assumes two different levels depending on the state of the input signal. It is not decisive whether the signal is forwarded passively from the input 203 of the level converter to the input 204a of the output coupling circuit 204, or the signal is provided in a buffered manner (for example, using the two inverter stages 240a, 240b) from the input 203 to the input 204a of the output coupling circuit 204.

Nevertheless, it may be desirable to control the transistor 221 with a signal inverted with respect to the signal at the input 203.

Moreover, circuitries complementary to the circuitries described herein can be realized. In this case, for example, n-channel transistors may be replaced by p-channel transistors, and vice versa.

Moreover, various types of field effect transistors may, of course, be employed, such as MOS field effect transistors or junction field effect transistors.

Besides, one, several ones or even all of the field effect transistors may be replaced with bipolar transistors. Here, it generally applies that gate terminals and base terminals correspond to each other and may generally be referred to as control terminals. Source terminals and emitter terminals also correspond to each other and generally are referred to as source terminals (since they provide charge carriers). Furthermore, drain terminals and collector terminals correspond to each other and are generally referred to as collection terminals (since they collect charge carriers).

Furthermore, it is not absolutely necessary that the driver circuit 210 include a plurality of inverters, even though inverters are especially easy to realize in CMOS technology. Rather, it may be sufficient to use non-inverting buffer stages or driver stages.

Figure 10:
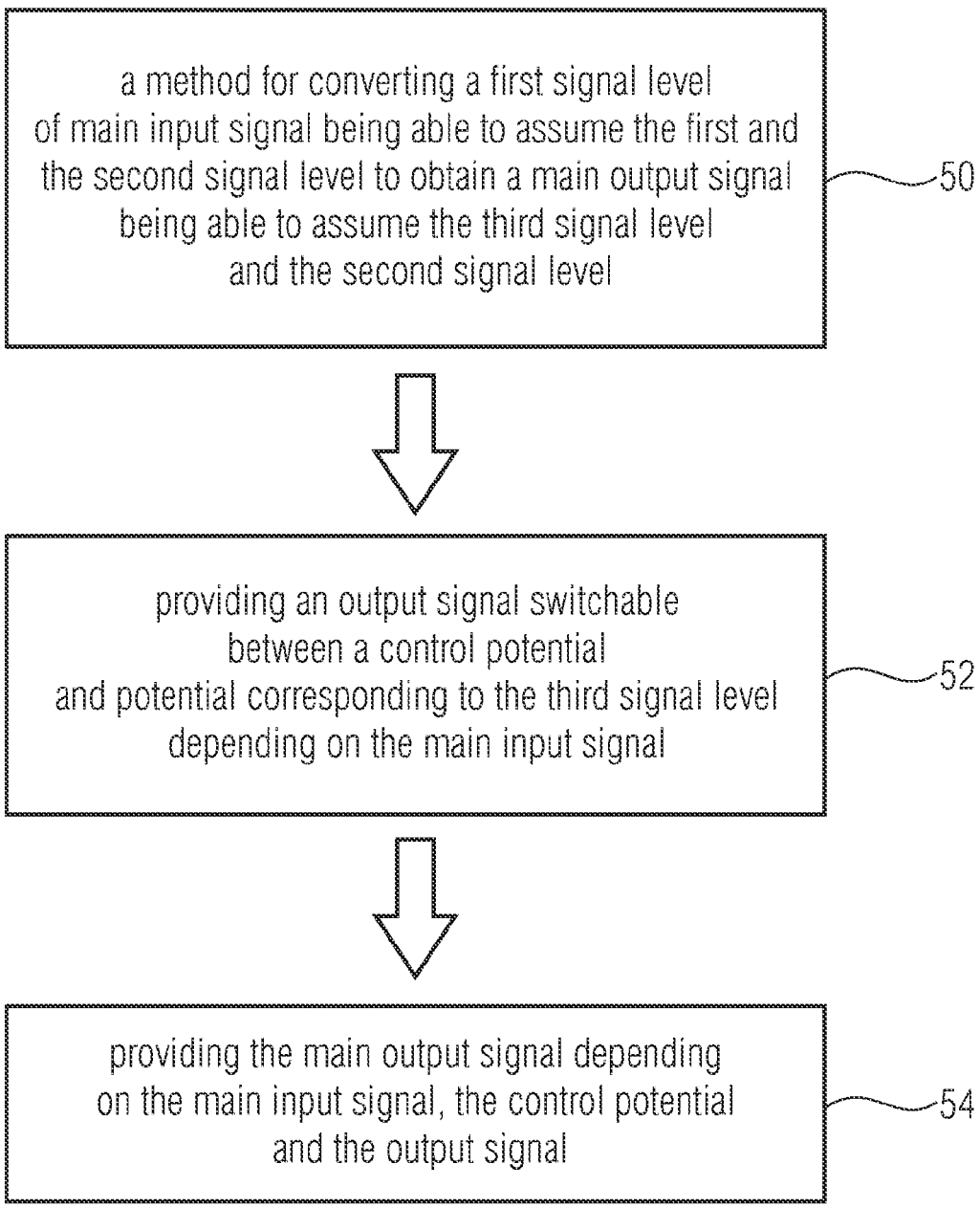
FIG. 10 shows a flow chart of the method for converting a signal level of an input signal.

FIG. 10 shows a flow chart of a method for converting, in step 50, a first signal level of a main input signal being able to assume the first and the second signal level at a main input terminal, to a third signal level at a main output terminal, to obtain a main output signal being able to assume the third signal level and the second signal level. The method comprises providing, in step 52, an output signal switchable between a control potential and a potential corresponding to the third signal level depending on the main input signal. Moreover, providing, in step 54, of the main output signal at the main output terminal depending on the main input signal, the control potential and the output signal.

The providing of the main output signal at the main output terminal may be performed by alternating switching on and off the p- and n-channel transistor of an inverter, depending on the main output signal connected to a first terminal of the p-channel transistor and on the output signal connected to a second terminal of the n-channel transistor. The control potential may be coupled to the control terminals of the p- and n-channel transistor and the main output terminal may be formed between the second terminal of the p-channel transistor and the first terminal of the n-channel transistor connected to each other.

The output signal connected to the second terminal of the n-channel transistor may be provided by a latch comprising two inverters connected in series with a feedback loop between the input and the output of the latch. The latch may be controllable by the main input signal. This may be achieved by a capacitor placed between the main input terminal and the latch input, which is used to control the feedback loop.

In another embodiment the method as described in context to FIG. 10 may provide an output signal, which is further comprising a preceding inversion of the output signal.

The method, as described in the context of FIG. 10, may be performed in another embodiment, such that the providing of the main output signal at the main output terminal is performed by alternating switching on and off the p- and n-channel transistor of an inverter, depending on the main input signal connected to a first terminal of the p-channel transistor and on the output signal connected to a second terminal of the n-channel transistor, wherein the control potential is coupled to the control terminals of the p- and n-channel transistor and the main output terminal is formed by the second terminal of the p-channel transistor connected to the first terminal of the n-channel transistor.

It is also feasible, that the method is changed to generate a fourth signal level at the main terminal output by utilizing a second latch, as described above.

Figure 11:
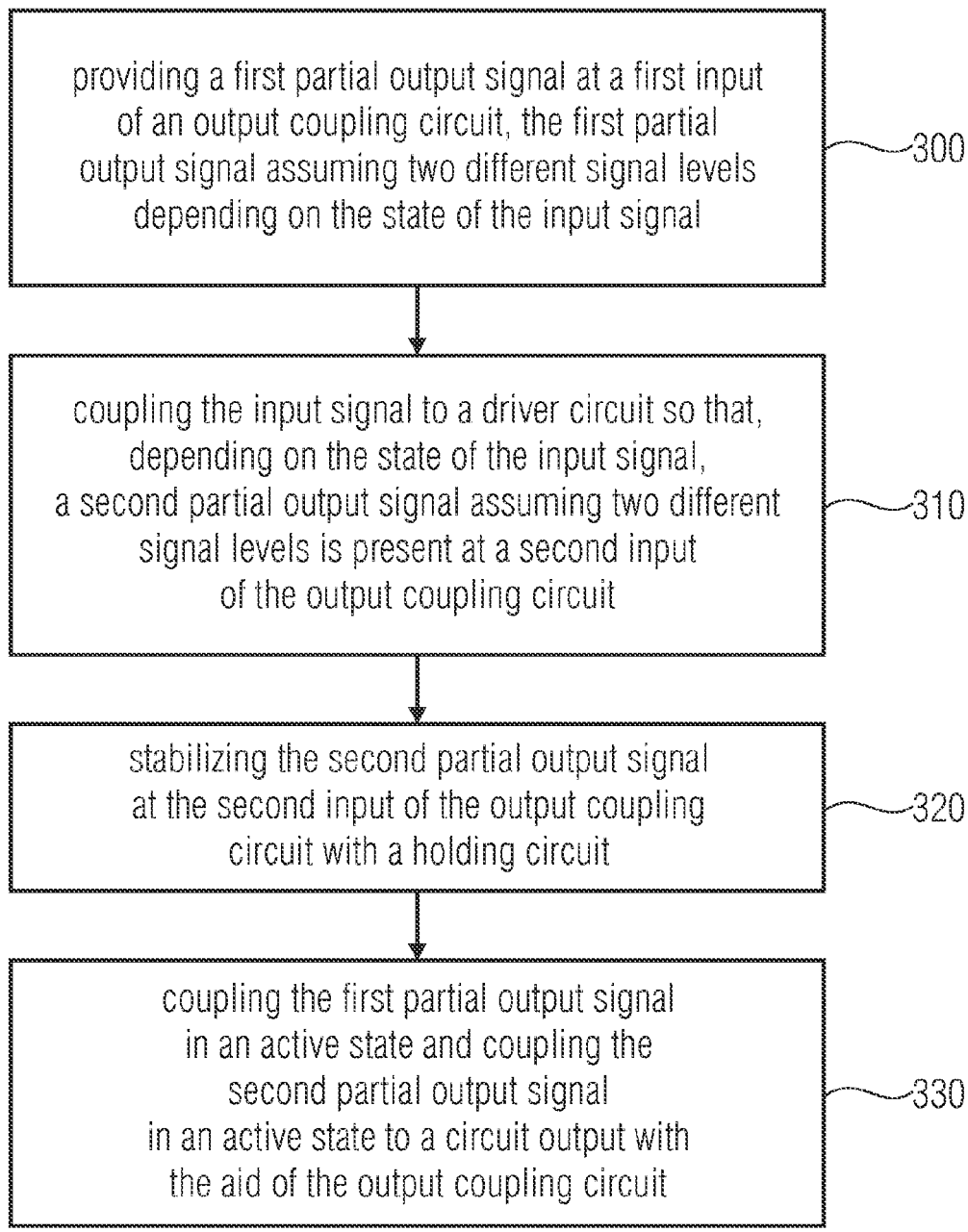
FIG. 11 is a flowchart of a method of providing an output signal at a circuit output according to a further embodiment.

The flowchart in FIG. 11 shows an embodiment of a method of providing an output signal at a circuit output. With the method, an output signal, which is switchable between a first output signal level and a second output signal level, can be provided on the basis of an input signal, which comprises a first input signal state and a second input signal state. The method comprises providing, in step 300, a first partial output signal at a first input of an output coupling circuit, wherein the first partial output signal assumes two different signal levels depending on the state of the input signal. The method further comprises coupling, in step 310, e.g., capacitively coupling, the input signal to a driver circuit. The coupling is performed such that, depending on the state of the input signal, a second partial output signal is present at a second input of an output coupling circuit. The second partial output signal may here assume two different signal levels depending on the state of the input signal. The method may be performed such that switching between the two signal levels of the second partial output signal is enabled or supported by capacitively coupling. In the method, stabilizing or holding, in step 320, the second partial output signal at a constant state of the input signal at a second input of an output coupling circuit is performed with holding means. Such holding means may, for example, comprise a voltage divider. Stabilizing, in step 320, thus may comprise holding the state of the second partial output signal with the aid of a voltage divider. The method may further comprise coupling, in step 330, the first partial output signal in an active state of the first partial output signal and coupling the second partial output signal in an active state of the second partial output signal to a circuit output with the aid of an output coupling circuit, wherein coupling is performed such that the output signal is provided at the circuit output. The method may be performed such that the first output signal level of the output signal corresponds to a first supply potential of the circuit, and that the second output signal level of the output signal corresponds to a second supply potential of the circuit.

In the following, another possible method will be explained briefly. The method of providing an output signal at a circuit output, which is switchable between a first output signal level and a second output signal level, on the basis of an input signal comprising a first input signal state and a second input signal state, may include providing (step 300) a first partial output signal, wherein the first partial output signal assumes two different signal levels depending on the state of the input signal. The method may further include providing a second partial output signal using a driver circuit, wherein the second partial output signal assumes two different signal levels depending on the state of the input signal. Providing the second partial output signal may include capacitively coupling (step 310) the input signal to the driver circuit, in order to achieve switching between the signal levels of the second partial output signal by capacitively coupling in response to a change in the state of the input signal. Providing the second partial output signal may further include actively stabilizing a state of the second partial output signal in the case of a constant state of the input signal. The method may further include providing the output signal depending on the first partial output signal and the second partial output signal, wherein the output signal is provided on the basis of the first partial output signal if the first partial output signal comprises a signal level corresponding to an active state of the first partial output signal, and wherein the output signal is provided on the basis of the second partial output signal if the second partial output signal comprises a signal level corresponding to an active state of the second partial output signal.

The methods may optionally be supplemented by all those features also described herein with respect to the corresponding devices. Moreover, the methods may optionally be performed using the devices or means described herein. Furthermore, the devices or means described herein may be formed so as to enable execution of the method.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A level converter for providing an output signal switchable between a first output signal level and a second output signal level at a circuit output on the basis of an input signal comprising a first input signal state and a second input signal state, the level converter comprising:
a driver circuit formed to provide a driver output signal so that the driver output signal is switchable between two different signal levels depending on the state of the input signal,
wherein a level range between the two signal levels associated with the first and second input signal states of the input signal and a level range between the two signal levels of the driver output signal are shifted with respect to each other,
wherein an input of the driver circuit is capacitively coupled to an input of the level converter in order to allow for switching between signal levels of the driver output signal by the capacitive coupling in response to a change in the state of the input signal, wherein the level converter comprises a holding circuit formed to keep a state of the driver output signal constant in case of a constant state of the input signal, wherein the holding circuit comprises a static feed-forward between the input of the level converter and the driver circuit input, wherein the static feed-forward comprises a coupling path passing in parallel to the capacitive coupling between the input of the level converter and the input of the driver circuit; and wherein there is a shift between a direct voltage level of the input signal present at the input of the level converter and a direct voltage level of an input signal present at the input of the driver circuit.

2. The level converter as claimed in claim 1, wherein the holding circuit comprises feedback from a driver circuit output to the driver circuit input.

3. The level converter as claimed in claim 1, wherein the level converter further comprises:

an output coupling circuit formed to receive a first partial output signal assuming two different signal levels depending on a state of the input signal at a first output coupling circuit input, and to receive the driver output signal assuming two different signal levels depending on the state of the input signal as a second partial output signal at a second output coupling circuit input, to couple the first partial output signal to the circuit output if the first partial output signal comprises an active state, and to couple the second partial output signal to the circuit output if the second partial output signal comprises an active state.

4. The level converter as claimed in claim 3, wherein the output coupling circuit comprises an inverter structure formed to couple the first partial output signal to the circuit output if the first partial output signal comprises an active state, and to couple the second partial output signal to the circuit output if the second partial output signal comprises an active state.

5. The level converter as claimed in claim 3, wherein the output coupling circuit comprises two output transistors complementary with respect to each other;

wherein control terminals of the output transistors complementary with respect to each other are connected so as to draw the control terminals to a common fixed potential, or to draw the control terminals to two fixed potentials different from each other; and wherein collection terminals of the transistors complementary with respect to each other are connected to the output, and wherein a source terminal of a first one of the output transistors is connected so as to receive the first partial output signal, and wherein a source terminal of a second one of the output transistors is connected so as to receive the second partial output signal.

6. The level converter as claimed in claim 1, wherein the level converter comprises a feed for a reference potential, a feed for a first supply potential and a feed for a second supply potential; and wherein the level converter is formed so that a signal level of a first partial output signal is switchable between the reference potential and the first supply potential, and that a signal level of the driver output signal, which serves as a second partial output signal, is switchable between the reference potential and the second supply potential.

7. The level converter as claimed in claim 6, wherein the holding circuit comprises a switchable voltage divider connected between the feed for the first supply potential and the feed for the second supply potential, wherein a tap of the switchable voltage divider is coupled to the input of the driver circuit.

8. The level converter as claimed in claim 7, wherein the switchable voltage divider is formed to draw the input of the driver circuit to one of the first supply potential or the second supply potential to an intermediate potential lying between the first and second supply potentials, depending on the state of the input signal of the level converter.

9. The level converter as claimed in claim 1, wherein the driver circuit comprises two inverter structures connected one behind the other, which are coupled between a feed for a reference potential and a feed for a second supply potential, and which are formed to provide a second partial output signal at a driver circuit output.

10. A level converter for providing an output signal switchable between a first output signal level and a second output signal level at a circuit output on the basis of an input signal comprising a first input signal state and a second input signal state, the level converter comprising:

a driver circuit formed to provide a driver output signal so that the driver output signal is switchable between two different signal levels depending on the state of the input signal, wherein a level range between the two signal levels associated with first and second input signal states of the input signal and a level range between the two signal levels of the driver output signal are shifted with respect to each other, wherein an input of the driver circuit is capacitively coupled to an input of the level converter in order to allow for switching between signal levels of the driver output signal by the capacitive coupling in response to a change in the state of the input signal, and wherein the level converter comprises a holding circuit formed to keep a state of the driver output signal constant in case of a constant state of the input signal, wherein the holding circuit comprises a voltage divider switchable depending on the state of the input signal and formed to draw the input of the driver circuit to two different static potentials depending on the state of the input signal.

11. The level converter as claimed in claim 10, wherein the voltage divider of the holding circuit comprises a plurality of series-connected resistors, or a plurality of series-connected diodes acting as resistive elements, or a plurality of transistors as voltage-splitting devices;

wherein load paths of the transistors are connected in series;

wherein, in the transistors serving as voltage-splitting devices, a control terminal of a respective transistor is connected to a load path terminal of a respective transistor so that series-connected transistors act as diodes, or wherein the voltage divider of the holding circuit comprises, as voltage-splitting elements, a plurality of transistor pairs formed to act as diodes;

wherein the transistor pairs serving as voltage-splitting devices comprise two transistors each complementary with respect to each other, the load paths of which are coupled at an intermediate node and connected in series, in order to form an overall load path of a transistor pair;

wherein control terminals of complementary transistors belonging to a respective transistor pair are connected to the respective intermediate node; and wherein the overall load paths of the transistor pairs are connected in series to form a voltage-splitting series connection.

12. A level converter for converting a first signal level of a main input signal being able to assume the first and a second signal level at a main input terminal to a third signal level at a main output terminal to acquire a main output signal being able to assume the third signal level and a fourth signal level, wherein the fourth signal level is equal to the second signal level or different from the second signal level, comprising:
    a latch coupled between a control potential and a potential corresponding to the third signal level and being controllable by the main input signal to switch a latch output between the control potential and the potential corresponding to the third signal level; and
    a capacitor being able to control by the main input signal to switch the latch output between the control potential and the potential corresponding to the third signal level, wherein the capacitor is connected, on one side, to the main input signal and, on an other side, to an input and an output of the latch.

13. The level converter as claimed in claim 12, wherein the control potential corresponds to the first signal level.

14. The level converter as claimed in claim 12, wherein the latch comprises a first and a second latch inverter connected in series, each latch inverter comprising:
    a p-channel transistor and an n-channel transistor, both being connected in parallel to each other, with the p-channel transistor comprising a first terminal connected to the control potential and a second terminal connected to a first terminal of the n-channel transistor; and with the second terminal of the n-channel transistor being connected to the potential corresponding to the third signal level; and
    wherein a control terminal of the p- and n-channel transistor of the first latch inverter are connected to form a latch input of the latch, the control terminals of the p- and n-channel transistor of the second latch inverter are connected to an output node of the first latch inverter, formed between the second terminal of the p-channel transistor of the first latch inverter and the first terminal of the n-channel transistor of the first latch inverter, an output node of the second latch inverter, formed between the second terminal of the p-channel transistor of the second latch inverter and the first terminal of the re-channel transistor of the second latch inverter, being connected to the latch output.

15. The level converter as claimed in claim 14, wherein the latch input and the latch output are connected to form a feedback loop.

16. The level converter as claimed in claim 12, wherein the latch comprises an x- and a y-channel field effect transistor, formed in an x-doped substrate of a first doping type, wherein the x-channel field effect transistor comprises an x-doped drain region, an x-doped source region and a transistor channel between the x-doped source region and the x-doped drain region formed in a first y-well region of the x-doped substrate, and wherein the y-channel field effect transistor comprises a y-doped drain region, a y-doped source region and a transistor channel between the x-doped source region and the x-doped drain region formed in an x-well region residing within the first or a second y-well region of the x-doped substrate; wherein x is one of p and n, and y is an other of p and n.

17. The level converter as claimed in claim 12, wherein the level converter is adapted for converting the second signal level to the fourth signal level at a main output terminal to acquire the main output signal being able to assume the third signal level and the fourth signal level.

18. The level converter as claimed in claim 17, wherein the control potential is corresponding to the first signal level and/or the second signal level is corresponding to the fourth signal level.

19. A method for converting a first signal level of a main input signal being able to assume the first and a second signal level at a main input terminal, to a third signal level at a main output terminal to acquire a main output signal being able to assume the third signal level and the second signal level, the method comprising:
    providing, using a latch, an output signal switchable between a control potential, wherein the control potential is different to the second signal level of the main input signal and a potential corresponding to the third signal level depending on the main input signal; and
    switching, using a capacitor, a latch output of the latch between the control potential and the potential corresponding to the third signal level, wherein the capacitor is connected, on one side, to the main input signal and, on an other side, to an input and an output of the latch.

20. The method as claimed in claim 19 further comprising a capacitively coupling of the main input signal for providing an output signal switchable between the control potential and a potential corresponding to the third signal level depending on the main input signal.

21. A method of providing an output signal at a circuit output, which is switchable between a first output signal level and a second output signal level, on the basis of an input signal comprising a first input signal state and a second input signal state, the method comprising:
    providing a driver output signal using a driver circuit, wherein the driver output signal assumes two different signal levels depending on the state of the input signal;
    wherein providing the driver output signal comprises capacitively coupling the input signal to the driver circuit in order to achieve switching between signal levels of a second partial output signal by capacitively coupling in response to a change in the state of the input signal,
    wherein providing the driver output signal comprises actively stabilizing a state of the driver output signal using a static feed-forward between the input signal and an input of the driver circuit in case of a constant state of the input signal,
    wherein the static feed-forward comprises a coupling path passing in parallel to the capacitive coupling between the input signal and the input of the driver circuit, and
    wherein there is a shift between a direct voltage level of the input signal and a direct voltage level of an input signal present at the input of the driver circuit.

* * * * *